United States Patent
Hsiao

(10) Patent No.: US 7,145,853 B2
(45) Date of Patent: Dec. 5, 2006

(54) METHOD AND RELATED APPARATUS FOR EVALUATING BETA-PARAMETER ACCORDING TO WRITE-IN RESULT OF PORTION OF WRITE-IN DATA WITH SPECIFIC CONTENT WHILE PERFORMING OPTIMAL POWER CONTROL OF OPTICAL DISK DRIVE

(75) Inventor: Yuan-Kun Hsiao, Taipei Hsien (TW)

(73) Assignee: VIA Optical Solution, Inc., Hsin-Tien (TW)

( * ) Notice: Subject to any disclaimer, the term of this patent is extended or adjusted under 35 U.S.C. 154(b) by 431 days.

(21) Appl. No.: 10/709,031

(22) Filed: Apr. 8, 2004

(65) Prior Publication Data

US 2005/0018562 A1    Jan. 27, 2005

Related U.S. Application Data

(60) Provisional application No. 60/461,578, filed on Apr. 10, 2003.

(51) Int. Cl.
 *G11B 5/09*   (2006.01)
 *G11B 7/00*   (2006.01)
(52) U.S. Cl. .................. 369/47.53; 369/47.5; 369/59.1
(58) Field of Classification Search ..................... None
See application file for complete search history.

(56) References Cited

U.S. PATENT DOCUMENTS

| | | | |
|---|---|---|---|
| 5,475,666 A * | 12/1995 | Ito et al. ................... | 369/47.52 |
| 5,689,482 A | 11/1997 | Iida | |
| 6,333,902 B1 | 12/2001 | Shim | |
| 6,345,023 B1 | 2/2002 | Fushimi et al. | |
| 6,661,752 B1 | 12/2003 | Eom | |
| 6,891,785 B1 | 5/2005 | Yamamoto et al. | |
| 7,053,919 B1 * | 5/2006 | Nagano ................... | 369/47.53 |
| 2002/0131347 A1 | 9/2002 | Rarymakers | |
| 2003/0043714 A1 * | 3/2003 | Takeda ..................... | 369/47.53 |
| 2003/0179665 A1 | 9/2003 | Iwazawa et al. | |
| 2004/0213119 A1 | 10/2004 | Van Vierken | |
| 2005/0073923 A1 | 4/2005 | Tobita | |

* cited by examiner

*Primary Examiner*—Muhammad Edun
(74) *Attorney, Agent, or Firm*—Winston Hsu

(57) ABSTRACT

When performing OPC, data including a plurality of first sequences and second sequences with specified contents are written onto the optical disk. A read result corresponding to the written data is then read. The read result is high-pass filtered such that effects corresponding to the second sequences are contained in a portion of the read result corresponding to the first sequences. Since the first sequences have specified contents, the portion of the read result corresponding to the first sequences are detected, and the beta-parameter is evaluated only according to the portion of the read result corresponding to the first sequences.

20 Claims, 8 Drawing Sheets

METHOD AND RELATED APPARATUS FOR EVALUATING BETA-PARAMETER ACCORDING TO WRITE-IN RESULT OF PORTION OF WRITE-IN DATA WITH SPECIFIC CONTENT WHILE PERFORMING OPTIMAL POWER CONTROL OF OPTICAL DISK DRIVE

BACKGROUND OF INVENTION

1. Field of the Invention

The present invention provides a method and related apparatus for performing optimal power control, and more particularly, a method and related apparatus for evaluating a beta-parameter according to a read result of portion of write-in data with specific content.

2. Description of the Prior Art

In modern information society, small, light, high-density, and low-cost optical disks have become one of the most popular non-volatile storage devices. With development of CD-R drives and Compact Disk Recordable drives, users can store personal data in an optical disk. Since technologies for writing (burning) data into an optical disk need high precision and high accuracy, developmental issues of information technologies have focused on how to store data with an optimal write-in power.

In general, when writing data into an optical disk, a CD-R drive emits laser beams with a specific power onto the optical disk, so as to bring about specific physical or chemical reactions for the optical disk to form a plurality of pits and lands. Owing to different reflection coefficients of the pits and the lands corresponding to a laser beam, an optical disk drive can read data stored in the optical disk by detecting reflection intensity of the pits and lands after emitting proper power laser beams onto the optical disk. However, optical disks made by different manufacturers usually have different physical/chemical characters while optical disk drives with different brands and models also have different laser emitters, rotational speeds, etc. Therefore, a proper power degree used for forming pits and lands onto the optical disk is a key issue during associated data writing operation.

In order to choose a preferred write-in power, the optical disk drive performs optimal power control before writing data onto the optical disk. When performing optimal power control, the optical disk drive employs different write-in powers to write default write-in data onto the optical disk, and then reads back the just write-in data from the optical disk, so as to determine whether the currently used write-in power is an optimal power. Please refer to FIG. 1, which illustrates a waveform-timing diagram of a write-in data 10 and two possible corresponding read results 12A, 12B during relative performing optimal power control procedure, wherein the X- and Y-axis indicates time scale and waveform amplitude, respectively. The read result 12A is a result when writing the write-in data 10 into the optical disk with a preferred write-in power, while the read result 12B is a result when writing with an improper power.

As those skilled in the art recognize, digital data is properly coded before being written into the optical disk. Generally, in protocols of CD-R/RW, Compact Disk Recordable/ReWriteable, or DVD-R/RW, DVD+R/RW, Digital Versatile Disk R/RW, specific streams of coded data include bits with the same content. For example, in protocols of CD-R/RW, a stream of the coded data includes at most 11 bits with the same content, but at least 3 bits with the same content, while in the DVD protocol, a stream of the coded data includes at most 14 bits with the same content. Owing to original data after coding includes different streams with different numbers of bits, a write-in data should include streams with different numbers of bits for simulating data writing with different degree of write-in powers.

In FIG. 1, the write-in data 10 includes streams with different numbers of bits. For example, a stream 14A includes three digital "0"s between time points ta6 and ta1, which continues for a 3T duration Ta, where T is a bit duration. Also, a stream 14B with the duration Ta includes three "1"s between time points ta1 and ta2. Besides, a stream 16A includes 14 "0"s between time points ta5 and ta6, which continues with a 14T duration Tb, while a stream 16B with the duration Tb includes 14 "1"s between time points ta4 and ta5.

Because of different reflection coefficients, the pits and the lands of the optical disk can properly represent "0" and "1". Therefore, the optical disk drive can decide each bit whether "0" or "1" by comparing the read result with a zero level. When writing data with a preferred write-in power, the read signal should be the read result 12A. For example, the write-in data 10 changes data status (which means the data changes from "0" to "1", or vice versa) at time points ta1, ta2, ta3, ta4, ta5, ta6, and ta7, while the read result 12A corresponding to the time points responds to zero-crossings (which means a signal level changes from a level greater than a zero level L0 to a level smaller than the zero level L0, or vice versa). In other words, the read result 12A can be decoded as "1" streams during a duration Ta from time points ta2 to ta3, a duration Tb from time points ta4 to ta5, and a duration Ta from ta6 to ta7, where the level of the read result 12A is greater than the zero level L0. Also, the read result 12A can be decoded as "0" streams during a duration Ta from time points ta1 to ta2, a duration Ta from time points ta3 to ta4, and a duration Tb from ta5 to ta6, where the level of the read result 12A is smaller than the zero level L0.

However, if the write-in power deviates from an ideal power, the read signal should be the read result 12B in FIG. 1 because the optical disk drive cannot form proper pits and lands with improper laser power. In this case, the read result 12B cannot represent original data in that the read result 12B crosses the zero level L0 at time points tb1, tb2, tb3, tb4, tb5, tb6, and tb7, which can not respond to the write-in data 10 from time points ta1 to ta7 when changing data status. For example, a duration of the read result 12B between time points tb1 and tb2, which level is smaller than the zero level L0, is obviously smaller than a duration between time points tb2 and tb3, which level is greater than the zero level L0. However, the fact is that the streams 14A and 14B corresponds to the two durations of the read result 12B respectively with the same length. Therefore, when the write-in power deviates from the ideal power, the read result 12B cannot represent the length of stream 14A is equal to the length of stream 14B.

Besides, in FIG. 1, lengths of the streams affect the read result corresponding to the streams. For example, when an optical disk drive writes a longer "0" stream onto an optical disk with laser beams of larger power, deeper pits are formed. Relatively, when writing a shorter "0" stream, the laser beam has a shorter duration and forms shallower pits. Since different pit depths have different reflection coefficients, when reading the "0" streams with different lengths, portions of the read result corresponding to the "0" streams have different signal values.

For example, in FIG. 1, because the "0" stream 16A between time points ta5 and ta6 is longer than the "0" stream 14A between time points ta1 and ta2, a portion of the optical disk corresponding to the stream 16A reflects weaker laser beams with deeper pits. Even if both the streams 14A and 16A represent "0", the signal level of the read result 12A between time points ta5 and ta6 is lower than that between time points ta1 and ta2. As FIG. 1 illustrates, the lowest levels of the read result 12A between time points ta5 and ta6 and between time points ta1 and ta2 are levels Ln1 and Ln0 respectively, wherein the level Ln1 is lower than the level Ln0. Similarly, as to the "1" streams 14B and 16B, the signal level of the read result 12A corresponding to the longer stream 16B can reach a level Lp1 between time points ta4 and ta5, while the signal level of the read result 12A corresponding to the stream 14B reaches a lower level Lp0 between time points ta1 and ta2.

The write-in power also affects waveforms of the read result. The absolute value of the lowest level Ln0 of the read result 12A between time points ta1 and ta2 is equal to the absolute value of the highest level Lp0 of the read result 12A between time points ta2 and ta3, which means that the stream 14A of the write-in data 10 between time points ta1 and ta2 has the same length (or number of bits) as the stream 14B between time points ta2 and ta3. Similarly, the absolute value of the highest level Lp1 of the read result 12A between time points ta4 and ta5 is equal to the absolute value of the lowest level Ln1 between time points ta2 and ta3, which means that the streams 16B and 16A have the same lengths.

Contrarily, in the real case as the read result 12B shows, the waveform is not so symmetric as the ideal read result 12A. For example, the read result 12B has a lowest level Ln3 between time points tb1 and tb2 corresponding to the stream 14A, and a highest level Lp3 between time points tb2 and tb3 corresponding to the stream 14B. However, the absolute value of the level Lp3 is larger than the absolute value of the level Ln3; that is, the read result 12B cannot represent the equal length of the streams 14A and 14B. Also, the absolute value of the highest level Lp2 of the read result 12B corresponding to the stream 16B between time points tb4 and tb5 is not equal to the absolute value of the lowest level Ln2 corresponding to the stream 16A between time points tb4 and tb5.

In summary, after writing the write-in data onto the optical disk with an ideal power, each portion of the read result corresponding to the streams with the same lengths should have the same durations during two zero-crossing time points and should also have the same amplitude. On the other hand, if the write-power deviates from the ideal power, pits and lands with incorrect depths cannot represent streams with correct lengths and content. Furthermore, even if streams have the same length, the corresponding read signals do not keep the same duration and amplitude. In other words, according to durations of zero-crossings and amplitudes of the read result, the optical disk drive determines whether the write-in data is written onto the optical disk with a preferred write-in power. In general, a prior art optical drive with burn function sets a beta-parameter for responding to the read result quantitatively. When performing optimal power control, the optical disk drive writes with different write-in powers, calculates beta-parameters corresponding to the read result with the write-in powers, and then compares each beta-parameter. In this way, the optical disk drive chooses a preferred power approximating the ideal power from these write-in powers.

Please refer to FIG. 2, which illustrates a schematic diagram of a prior art optical disk drive 20 when performing optimal power control. The optical disk drive 20 includes a motor 22, a pick-up head 24, an access circuit 28, and a control module 30. The optical disk drive 20 further includes a peak hold circuit 32A, a bottom hold circuit 32B, and an analog to digital converter 34 for performing optimal power control. The motor 22 rotates an optical disk 26. The pick-up head 24 emits laser beams onto the optical disk 26 and receives reflections for data access. The control module 30 controls operations of the optical disk drive 20. The access circuit 28 drives the pick-up head 24 to write coded data onto the optical disk 26 under control of the control module 30. The pick-up head 24 transmits signals corresponding to the reflections through the access circuit 28 to the control module 30 after receiving the reflections from the optical disk 26. The peak hold circuit 32A generates an output signal after receiving an input signal and makes the output signal track to peaks of the input signal, while the bottom hold circuit 32B makes its output signal track to bottoms of its input signal. The converter 34 converts analog signals to digital signals under control of the control module 30.

When performing optimal power control, the access circuit 28 transmits the write-in data to the pick-up head 24, and the pick-up head 24 writes the write-in data onto the optical disk 26 with a default write-in power. Then, the pick-up head 24 reads the written data from the optical disk 26, and transmits a read result 36 through the access circuit 28 to the peak and the bottom hold circuits 32A and 32B. The peak hold circuit 32A tracks to peaks of the read result 36 and generates a corresponding signal 38A, while the bottom hold circuit 32B tracks to bottoms of the read result 36 and generates a corresponding signal 38B. The converter 34 converts the signals 38A and 38B alternatively to digital signals. According to the digital signals corresponding to the signals 38A and 38B, the control module 30 can calculate a beta-parameter corresponding to the write-in power. Please refer to FIG. 3 (also FIG. 2), which illustrates an amplitude-versus-time diagram of each signal of the optical disk drive 20 in FIG. 2 when performing optimal power control, where the X-axis is time scale, and the Y-axis is signal amplitude. As FIG. 3 illustrates, the signal 38A provided by the peak hold circuit 32A tracks to peaks of the read result 36 (a dotted line shown in FIG. 3), while the signal 38B provided by the bottom hold circuit 32B tracks to bottoms of the read result 36. The level of the signal 38A provided by the converter 34 at time point tc1 is a level LP0, and at time point tc2 is a level LB0. Considering the levels LP0 and LB0, the beta-parameter of the read result 36 can be calculated.

As mentioned above, whether the write-in power deviates from the ideal value can be determined whether amplitudes of the read result are symmetric to the zero level L0. In the prior art optical disk drive 20, the peak and the bottom hold circuits 32A and 32B track peaks and bottoms of the read result 36 for calculating amplitude of the read result 36, allowing calculation of the beta-parameter.

Nevertheless, as FIG. 3 illustrates, the peak/bottom hold circuits track extreme values of signals with capacitors, where electric leakage is inevitable, such that both the peak and the bottom hold circuits cannot keep tracking the extreme values stably, thereby affecting amplitude calculations of the read result 36. Take the signal 38A provided by the peak hold circuit 32A for example. When the peak hold circuit 32A starts tracking a peak level LP of the read result 36 at time point tc0, owing to electric leakage, the signal level of the signal 38A provided by the peak hold circuit 32A decreases gradually. Until at time point tc5 the signal level of the signal 38A is lower than the signal level LP0 of the read result 36, the peak hold circuit 32A starts to track the peak level LP again. That is, the converter 34 samples a level LP0 of the signal 38A at time point tc1, but the level LP0 is not the real peak level LP of the read result. Similarly, the extreme level of the signal 38B provided by the bottom hold circuit 32B should be a level LB, but actually, the converter 34 samples a level LB0 at time point tc2 instead of the extreme level LB. In other words, the sampling values of the signals 38A and 38B provided by the converter 34 cannot indicate the amplitude of the read result 36 exactly. Besides, sampling results provided by the converter 34 at different time points also cannot indicate the amplitude of the read result because of the same reason. For example, sampling results provided by the converter 34 at time points tc3 and tc4 are different from those at time points tc1 and tc2, with the result that the corresponding beta-parameters calculated by the control module 30 are also different. That is, the beta-parameters are not stable.

In addition, the converter 34 cannot sample the signals 38A and 38B at the same time, that is, the extreme values of the signals 38A and 38B are the values in different sampling times. It is correct to compare the peak value with the bottom value corresponding to the same length of the stream. If the peak extreme value of the signal 38A is sampled by the converter 34 corresponds to the short data stream, but the bottom value of the signal 38B is sampled corresponds to the long data stream because of the different sampling time, the beta-parameter will not be accurate.

Please refer to FIG. 4. FIG. 4 illustrates functional blocks of another well-known optical disk drive performing optimal power control. The optical disk drive 40 comprises a pick-up head 44, an access circuit 48, a control module 50, a high pass filter 42, a slicer 46, a charger 52A, a discharger 52B, a resistor R0, and a capacitor C0. The control module 50 controls the operation of the optical disk drive 40. When performing optimal power control, the control module 50 controls the access circuit 48 to transmit write-in data to the pick-up head 44. The pick-up head 44 writes the write-in data with a predetermined power onto the optical disk 26. The write-in data that was written in the optical disk 26 is sent back to the access circuit 48, which generates a read result 56A. The high-pass filter 42 filters the read result 56A and generates a filtered read result 56B. The slicer 46 slices the parts of the read data 56b which are higher or lower than a zero level L0 to sliced signals having fixed high and low levels, which are used to control the charger 52A and the discharger 52B. The charger 52A and the discharger 52B can be the controlled current sources. The charger 52A is able to charge the capacitor C0 through the resistor R0 to increase the voltage of the node N0. The discharger 52B is able to discharge the capacitor C0 through the resistor R0 to decrease the voltage of the node N0. Finally, the control module 50 calculates the beta-parameter according to the voltage of the node N0.

To further describe the principles of an optical disk drive performing optimal power control, please refer to FIG. 5 (as well as FIG. 4). FIG. 5 illustrates a waveform timing diagram of each relative signal of the optical disk drive 40 calculating the beta-parameter. The X-axis represents time, and the Y-axis represents the amplitude of each waveform. As described in FIG. 1, the write-in power deviates from the ideal value, the corresponding read result deviate from the zero level too. Accordingly, the periods between zero-crossing points do not represent the time period of the data streams of the same length. As for the case of the short data stream, the deviation from the zero level is more obvious. In FIG. 5, the read result 56A deviates from the zero level, especially the parts corresponding to short data streams between time intervals td1 to td4, and td6 to td8. The purpose of the high-pass filter 42 is to filter out DC corresponding to deviation of the read result 56A from the zero level. For example, the high frequency part of the read result 56A between td1 to td4 and td6 to td8 deviates from the zero level L0, so two parts larger and smaller than the zero level L0 in the read result 56A have no symmetric amplitude. After high-pass filtering, the high frequency part of the read result 56B has a more symmetric waveform, which results from the reservation of high frequency signals and blocking of low frequency signals during filtering. Equivalently speaking, the high-pass filter 42 removes the deviation of the high frequency part of the read result 56A corresponding to short data streams from the zero level L0.

In contrast to the high frequency part, the high-pass filter 42 adjusts the deviation of the low frequency part of the read result 56A to a larger degree. For example, between td4 and td5, the part of the read result 56A corresponding to a long data stream originally maintains two zero-crossing periods Tp0 and Tp1, but after being high-pass filtered, the read result 56B has similar DC shifting due to the effect of the reservation of high frequency part (the read result 56A in FIG. 5 is vertically shifted). Thus, the zero-crossing points, td4 and td5, of the read result 56B will be changed to td2 and td3. In other words, the deviation of the high frequency part (corresponding to the short data stream) of the read result 56A from the zero level L0 will be transformed to the change of the low frequency part (corresponding to the long data stream) of the read result 56B. Therefore, in the read result 56B, even for different data streams (especially the long data stream) with the same length, zero-crossing periods are different. The optical disc drive 40 of prior art calculates the beta-parameter according to the read result 56B to indicate if the write-in power deviates from the ideal value.

After the read result 56B is generated, the slicer 46 generates the sliced signal 58 according to the zero-crossing points of the read result 56B, letting the H level part of the sliced signal 58 correspond to the part of the result 56B which is higher than the zero level L0, and letting the L level part of the sliced signal 58 correspond to the part of the result 56B which is lower than the zero level L0. Therefore, the H level part and the L level part of the sliced signal 58 represent the zero-crossing periods of the read result 56B. According to the sliced signal 58 of the slicer 46, the charger 52A and the discharger 52B will charge and discharge the capacitor C0 in different times. The timing diagrams of 59A and 59B in FIG. 5 represent the charging time and the discharging time of the charger 52A and the discharger 52B, respectively. During the time when the sliced signal 58 maintains the level H, such as the time td2 to td3 and the time td4 to td5 in the timing diagram 59A, the charger 52A will charge the capacitor with a predetermined current. On the other hand, during the time when the sliced signal 58 maintains the level L, such as the time td1 to td2, the time td3 to td4 and the time td5 to td6 in the timing diagram 59B, the discharger 52B will discharge the capacitor with a predetermined current (usually the same as the predetermined charging current). Therefore, the charges stored in the capacitor CO are relative to the difference of zero-crossing periods of the read signal 56B. As the capacitor C0 is charged and discharged according to the sliced signal 58, the accumulated charges in the capacitor C0 are equivalent to the difference between the period when the read result 56B is larger than the zero level L0 and the period when the read result 56B is smaller than the zero level L0.

When the write-in power is closer to the ideal degree of power, the read results 56A and 56B should have almost perfect oscillation waveforms, and the period when the waveform is larger than the zero level L0 and the period when the waveform is lower than the zero level L0 should be almost equal, resulting in that the charges of the capacitor C0 are close to zero. In this situation, the write-in power is near the ideal value. Otherwise, if the write-in power further deviates from the ideal value, the read result 56A deviates from the zero level L0, as shown in FIG. 5. The deviation of read result 56A from the zero level L0 leads to the differences in the zero-crossing periods. The larger the differences in the zero-crossing periods, the more charges the capacitor C0 accumulates.

A disadvantage of the above prior art is that the accumulated charges in the capacitor C0 cannot sensitively and definitely indicate the difference of the zero-crossing periods of the read result 56B. Generally speaking, it is much easier for the deviation of the write-in power from the ideal value to result in shifting of the zero level in the high frequency part of the read result 56A. However, in the prior art technique shown in FIG. 4 and FIG. 5, both the high-frequency part and the low-frequency part of the read result 56B keep accumulating the difference of the zero-crossing periods. Because the purpose of high pass filtering is to reserve the AC (alternating current) part of the read result 56B, and an AC signal has equal positive and negative parts, the accumulation of the high-frequency zero-crossing periods and the low-frequency zero-crossing periods of the read result 56B after some time will cancel each other. In other words, the charges of the capacitor C0 are closer to zero after accumulation of the high-frequency zero-crossing periods and the low-frequency zero-crossing periods of the read result 56B even when the write-in power deviates from the ideal value, making the optimal control more difficult.

In summary, high-pass filtering transforms the deviation of the high-frequency part of the read result 56A to the differences of the zero-crossing periods of the low-frequency part of the read result 56B. If both high-frequency zero-crossing periods and the low-frequency zero-crossing periods are accumulated, the beta-parameter cannot definitely express the deviation of the write-in power.

SUMMARY OF INVENTION

This invention provides a method and an apparatus for performing optimal power control of an optical disk drive based on a beta-parameter for determining whether a default power is equal to an optimal write-in power for writing data onto an optical disk.

Briefly described, a method for performing optimal power control includes: (a) setting a write-in data, which includes a plurality of first sequences and second sequences; (b) writing the write-in data onto the optical disk with the default power, then reading the write-in data from the optical disk and generating a corresponding read result, the read result including a first read signal and a second read signal each corresponding to the first sequence and the second sequence; (c) processing an evaluation step according to a portion of the first read signal, instead of the second read signal, with signal level greater or smaller than a default level for summing the beta-parameter.

These and other objectives of the claimed invention will no doubt become obvious to those of ordinary skill in the art after reading the following detailed description of the preferred embodiment that is illustrated in the various figures and drawings.

DETAILED DESCRIPTION

Figure 6:
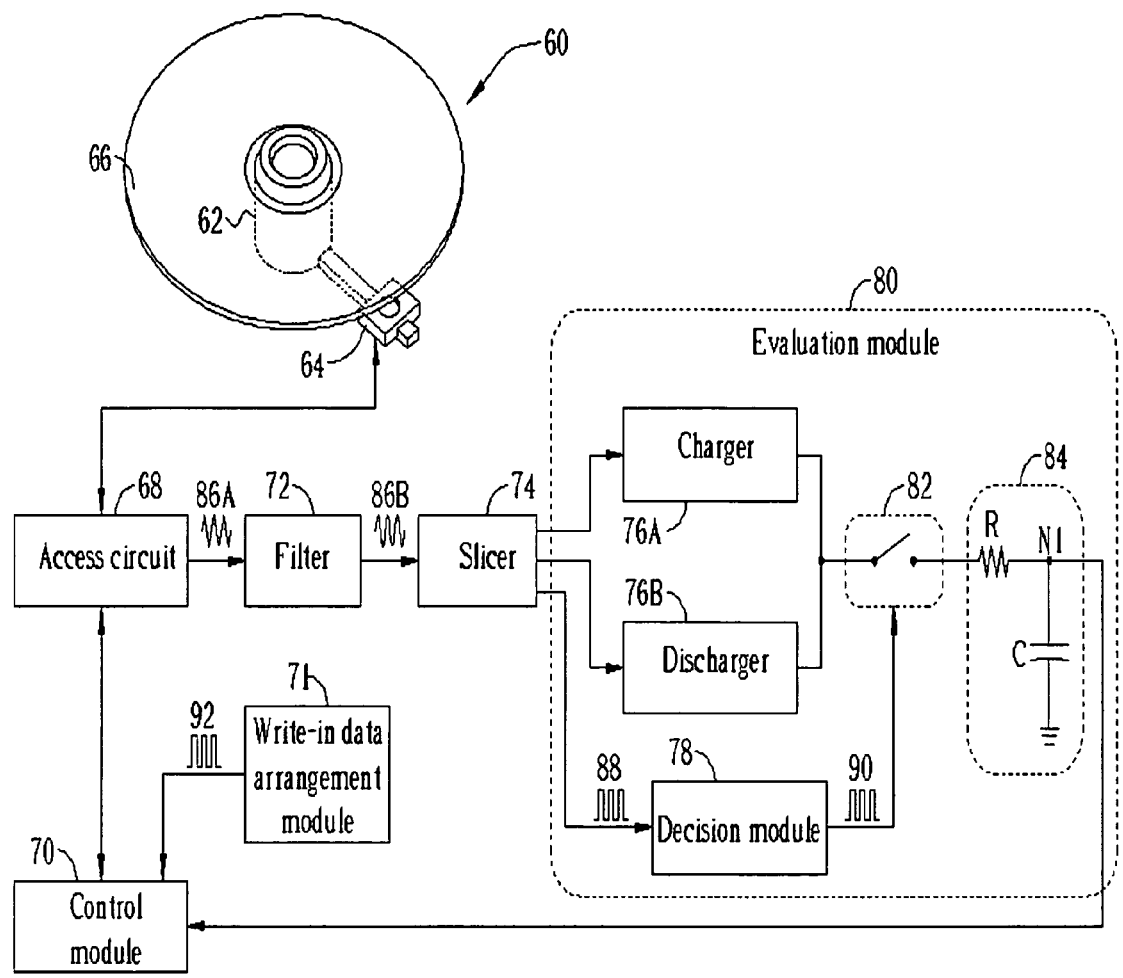
FIG. 6 illustrates a block diagram of a present invention optical disk drive.

Please refer to FIG. 6, which illustrates a schematic diagram of a present invention optical disk drive 60. The optical disk drive 60 includes a motor 62, a pick-up head 64, an access circuit 68, a control module 70, a high-pass filter 72, a slicer 74, a write-in data arrangement module 71 and an evaluation module 80. The evaluation module 80 includes a charger 76A, a discharger 76B, a decision module 78, a switch 82 and a storage unit 84. In FIG. 6, the storage unit 84 includes a resistor R and a capacitor C. The motor 62 rotates an optical disk 66. The pick-up head 64 emits laser beams onto the optical disk 66 and receives reflections for data access. The control module 70 controls operations of the optical disk drive 60. The access circuit 68 connects to the high-pass filter 72, and the slicer 74 slices a filtered signal provided by the high-pass filter 72, and then transmits a sliced signal to the decision module 78. According to the sliced signal, the optical disk drive 60 determines whether the charger 76A and the discharger 76B should charge or discharge. In the evaluation module 80, the switch 82 is between the storage unit 84 and the charger 76A or the discharger 76B for controlling connection between the storage unit 84 and the charger 76A or the discharger 76B. A control signal 90 provided by the decision module 78 controls the open or closed state of the switch 82. In addition, data stored in the storage unit 84 represents charge amount of the capacitor C. When the switch 82 is open, electricity provided by the charger 76A can be transmitted to the storage unit 84 for charging the capacitor C, which is equivalent to increasing a data amount stored in the storage unit 84, while the discharger 76B acts to decrease the data amount. When the switch 82 is closed, the connection between the charger 76A or the discharger 76B and the storage unit 84 is shut down, so as to prevent from electricity exchange; moreover, the data amount of the storage unit 84 is prevented from changing, and charge stored in the capacitor C returns to the control module 70 at a node N1.

In the present invention, the write-in data arrangement module 71 can arrange or record the write-in data 92 with specific content. In a preferred embodiment, the write-in data includes a plurality of sequences (each named a long sequence) comprising long streams, and a plurality of sequences (each named a short sequence) comprising short streams. Each long sequence includes two long streams with the same length (the same number of bits) and different content, while each short sequence includes two short streams with the same length and different content.

When the present invention optical disk drive 60 performs optimal power control, the control module 70 controls the pick-up head 64 to write the write-in data 92 provided by the write-in data arrangement module 71 onto the optical disk 66 with a default write-in power through the access circuit 68. Then, the pick-up head 64 reads the write-in data 92 from the optical disk 66, and generates a corresponding read result 86A through the access circuit 68 to the filter 72. The filter 72 outputs a read result 86B after high-pass filtering the read result 86A. The slicer 74 generates a slice signal 88 according to whether the signal level of the read result 86B is greater than a zero level. Moreover, the slicer 74 controls the charger 76A and the discharger 76B with the slice signal 88. Besides, the slice signal 88 is transmitted to the decision module 78 for determining which portions of the read result 86B (and the slice signal 88) corresponds to the long sequence. According to the decision result, the decision module 78 outputs the control signal 90 for controlling the switch 82, so that the connection between the charger 76A or the discharger 76B and the storage unit 84 is closed only when the slice signal 88 corresponds to the long sequence, while the control signal 90 controls the switch 82 to be open when the slice signal 88 corresponds to the short sequence, so as to prevent the charger 76A and the discharger 76B from changing the data amount of the storage unit 84. Finally, according to the data amount of the storage unit 84, the control module 70 can calculate a beta-parameter corresponding to the default write-in power.

Figure 7:
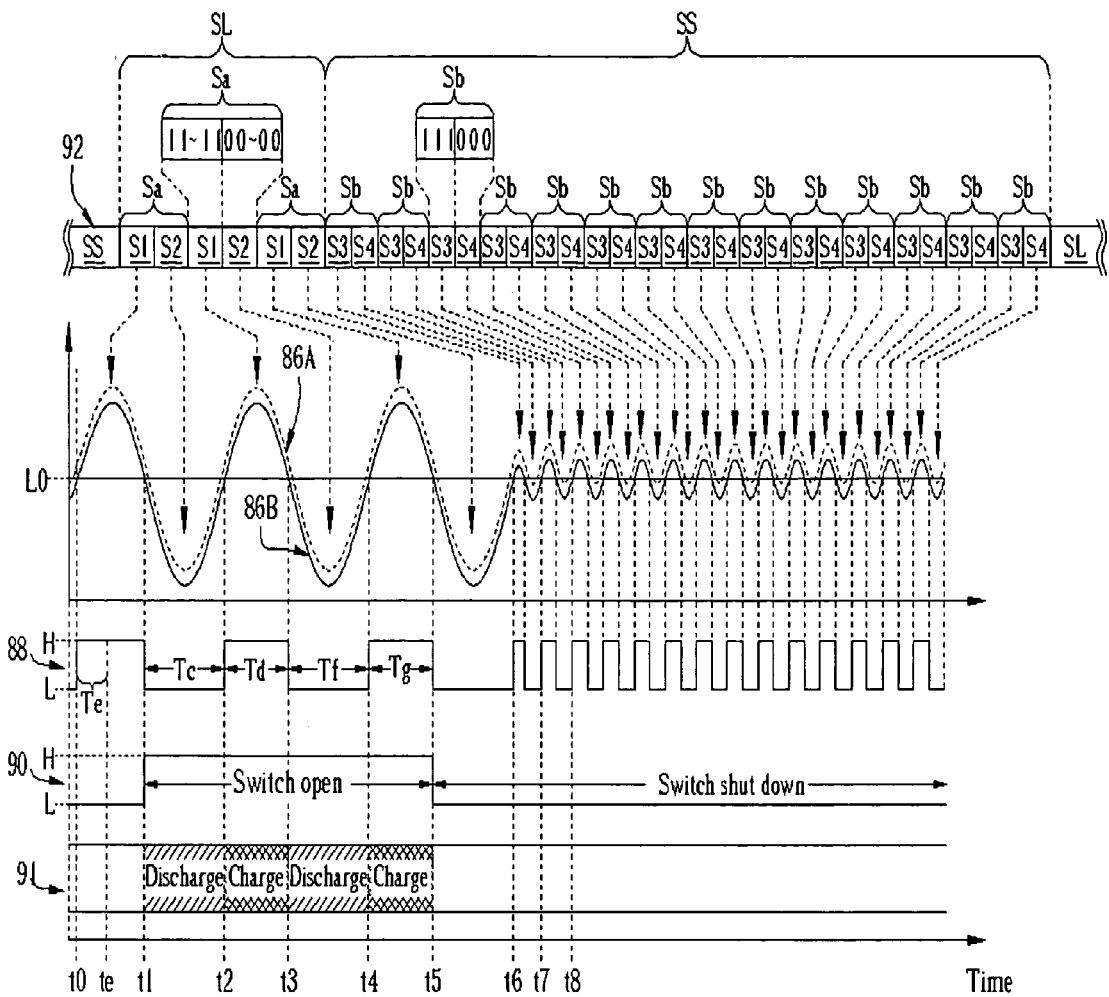
FIG. 7 illustrates a waveform versus time diagram of the optical disk drive in FIG. 6 while performing optimal power control.

Please refer to FIG. 7 (also FIG. 6), which illustrates a waveform-time diagram of the write-in data 92 and related signals when the present invention optical disk drive 60 performs optimal power control. The X-axis in FIG. 7 is time scale, while the Y-axis is amplitudes of the read results 86A, 86B, the slice signal 88, and the control signal 90. As mentioned above, the write-in data 92 includes a block SL comprising a plurality of long sequences Sa, and a block SS comprising a plurality of short sequences Sb, wherein each long sequence Sa includes a "1" long stream S1 and a "0" long stream S2, while each short sequence Sb includes a "1" short stream S3 and a "0" short stream S4. Additionally, data to be written into the optical disk is coded to a plurality of streams with different lengths. In DVD-R/RW protocols, the longest stream includes 14 bits (14T) of the same content (0 or 1), while the shortest stream includes three bits (3T) of the same content, so that the long streams S1 and S2 of the present invention include 14 "1" bits and 14 "0" bits respectively, while the short streams S3 and S4 of the present invention include three "1" bits and three "0" bits respectively. Similarly, in protocols of CD-R/RW, the longest and the shortest streams include 11 and three bits (11T and 3T) respectively, so that the long streams S1 and S2 of the present invention should be 11 bits, and the short streams S3 and S4 should be three bits.

Figure 1:
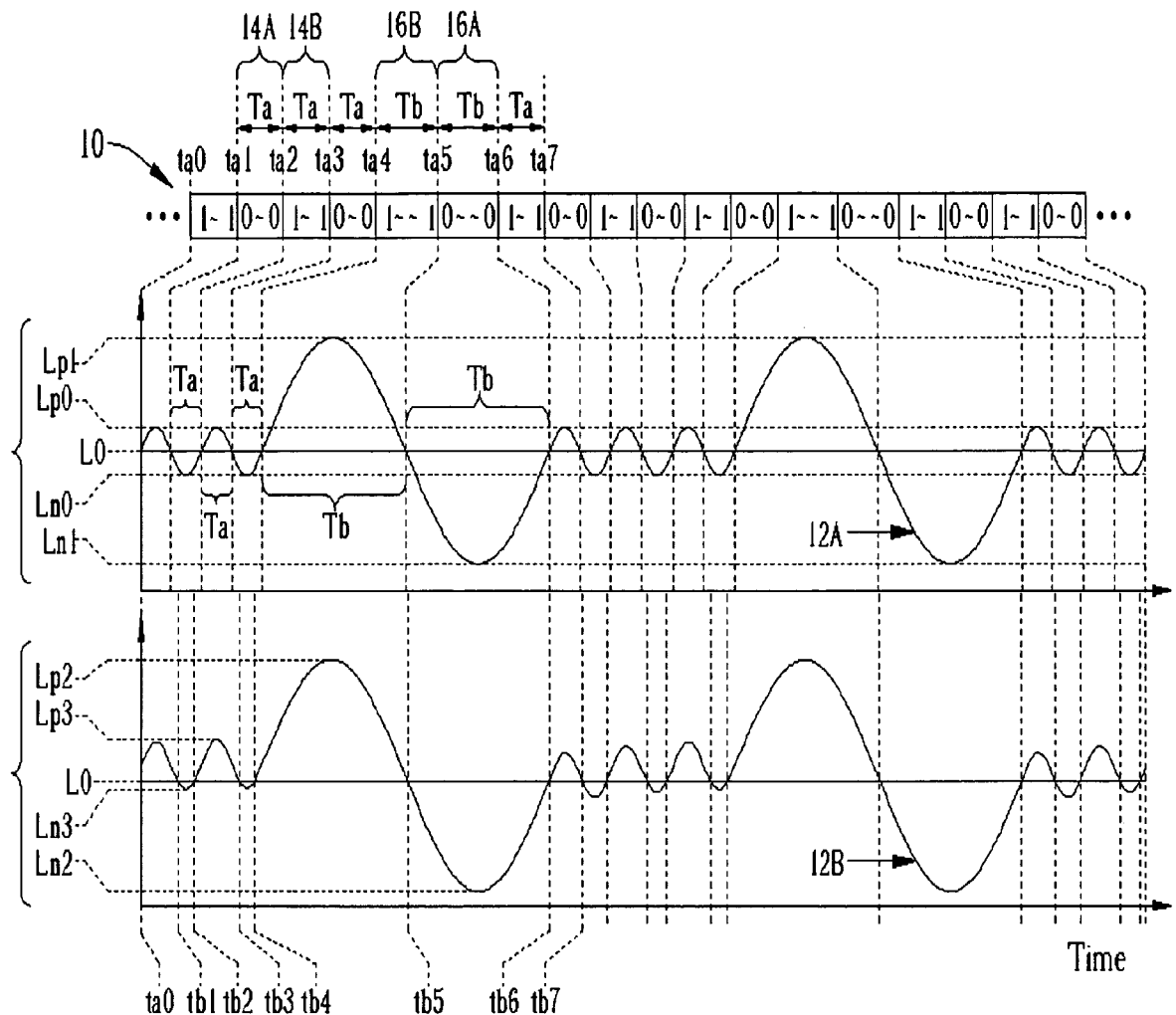
FIG. 1 illustrates a waveform versus time diagram of a read result provided by a prior art optical disk drive.
Figure 2:
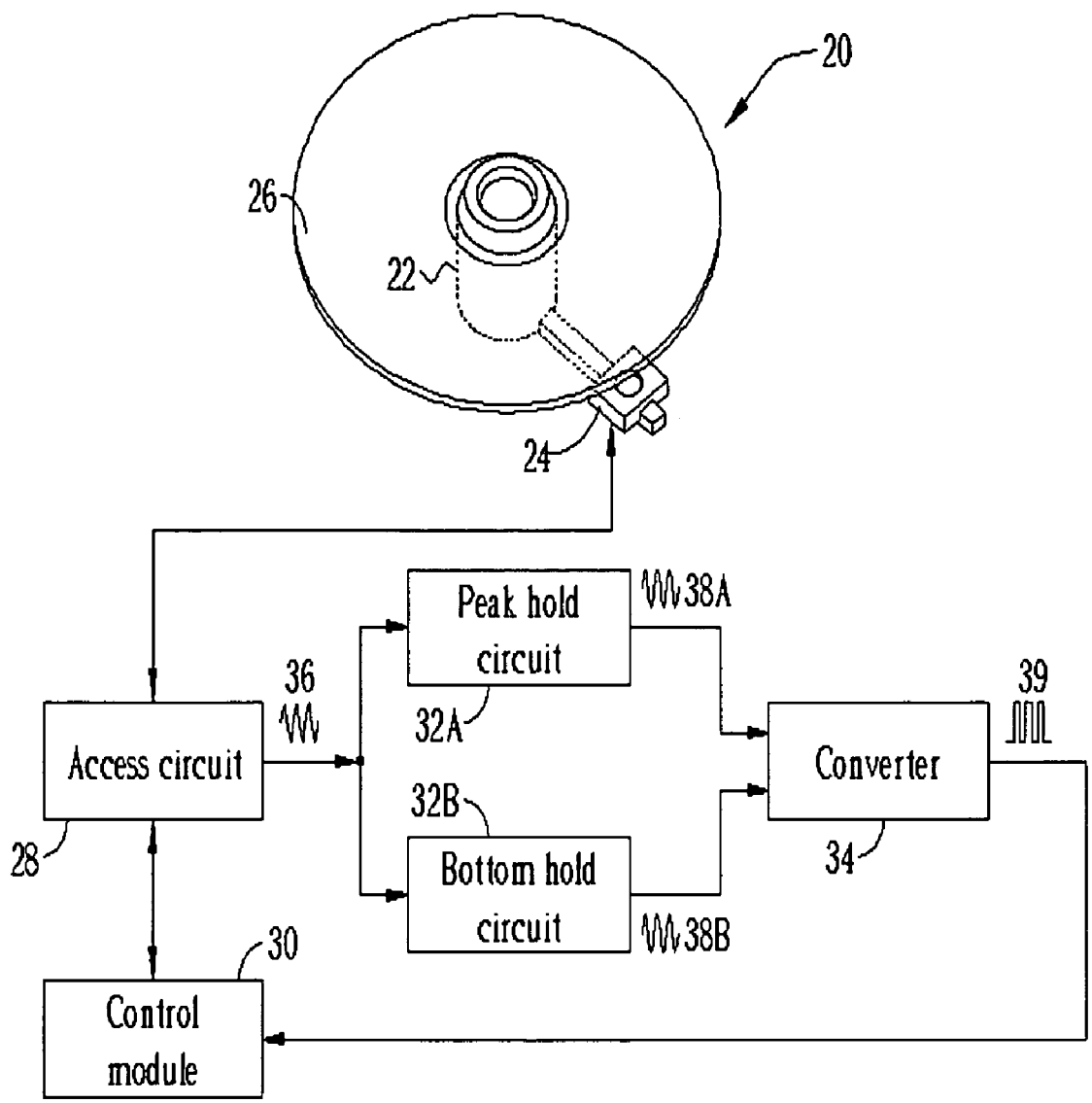
FIG. 2 illustrates a block diagram of a prior art optical disk drive.
Figure 3:
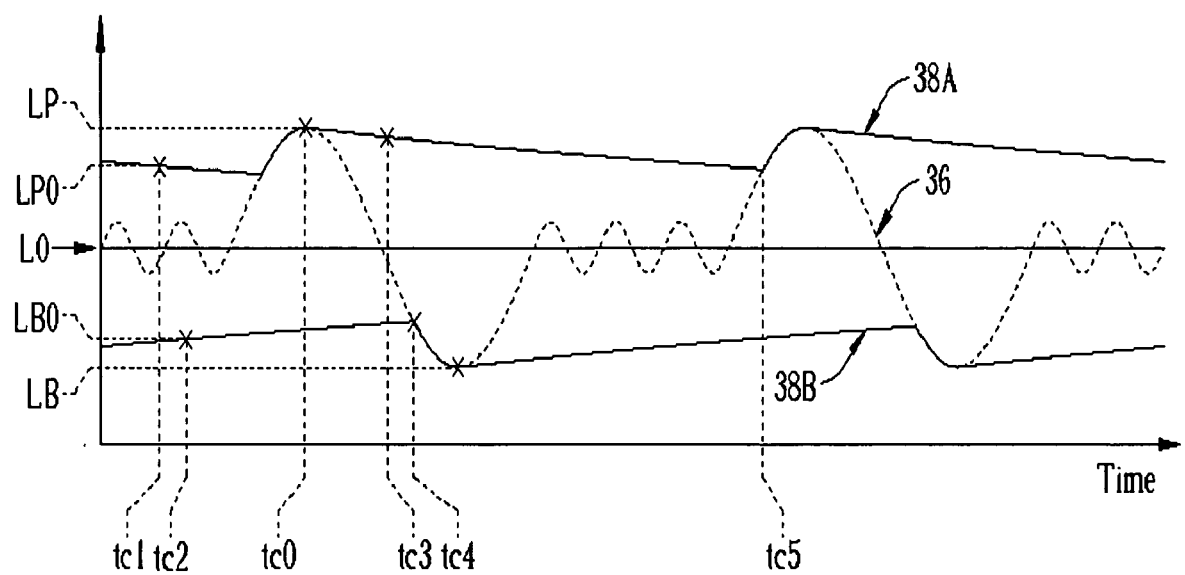
FIG. 3 illustrates a waveform versus time diagram of the optical disk drive in FIG. 2 while performing optimal power control.
Figure 4:
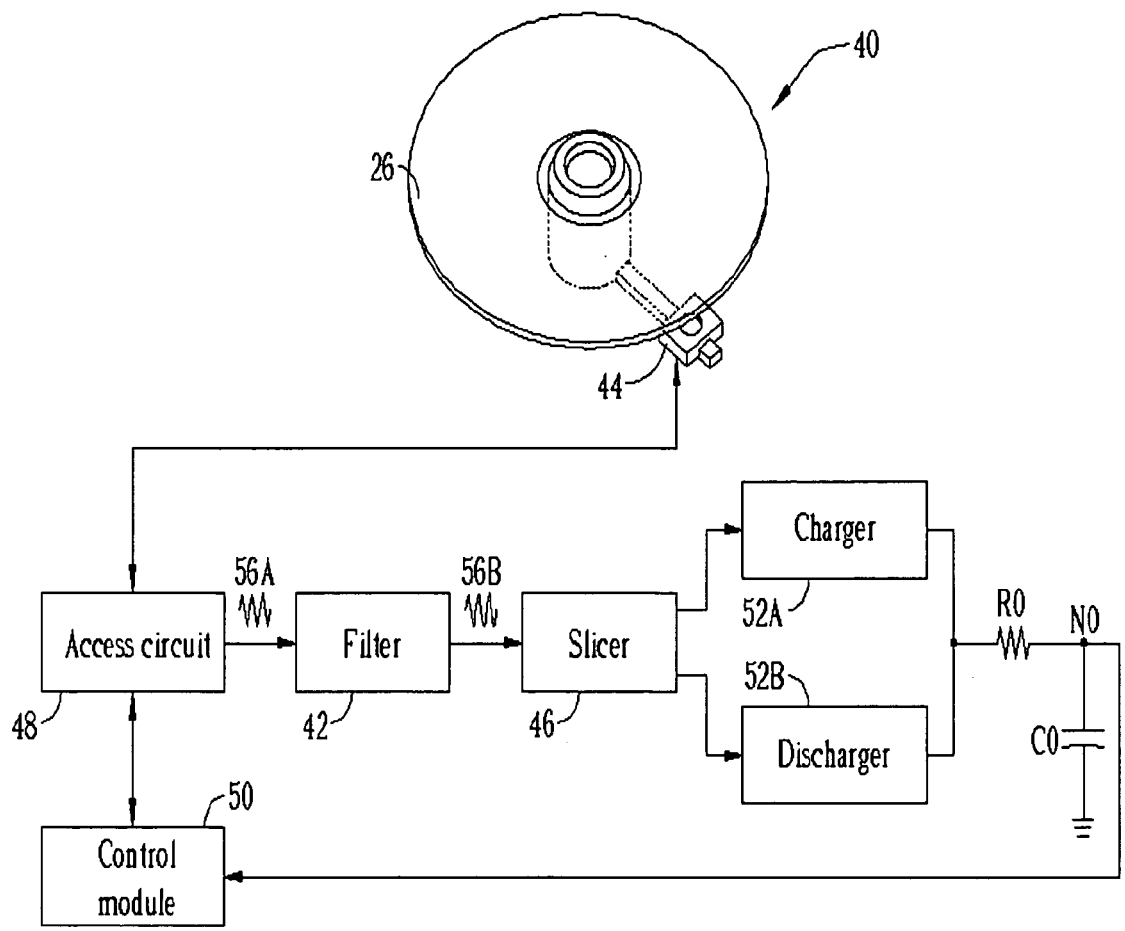
FIG. 4 illustrates a block diagram of a prior art optical disk drive.
Figure 5:
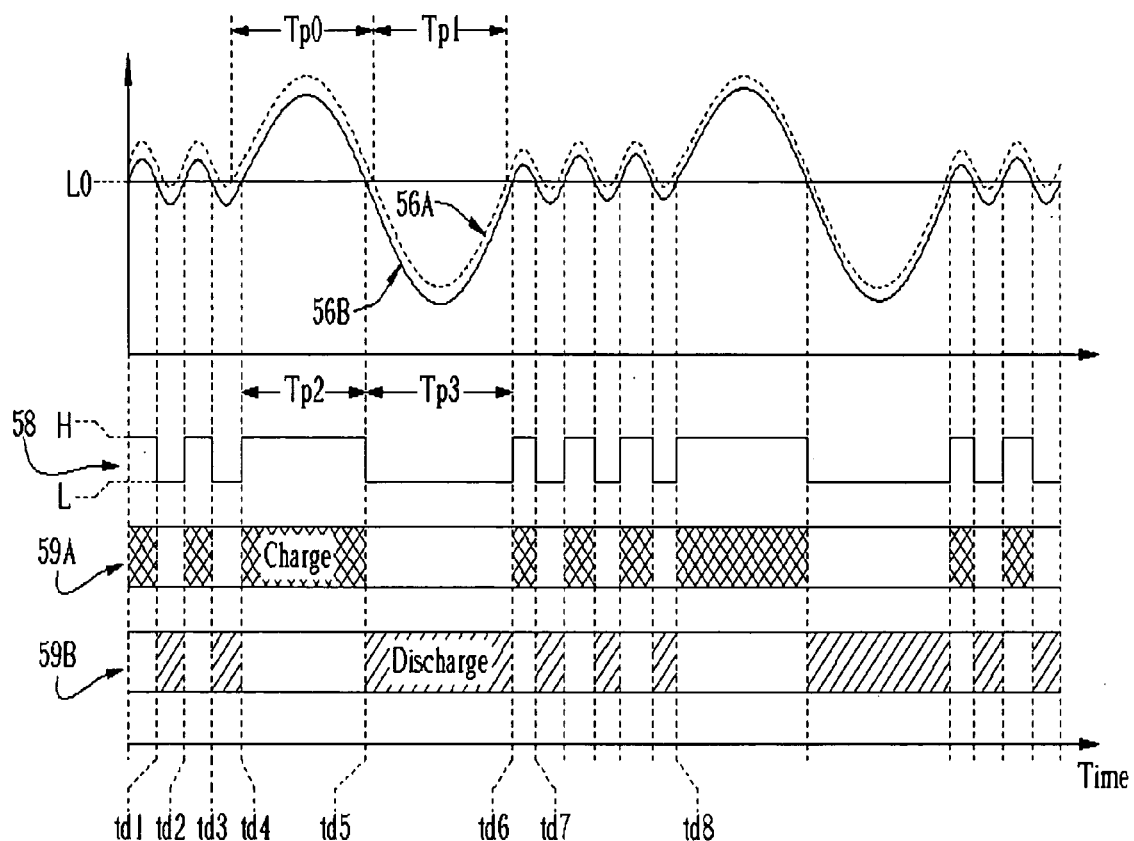
FIG. 5 illustrates a waveform versus time diagram of the optical disk drive in FIG. 4 while performing optimal power control.

As mentioned regarding FIG. 1, two streams of a sequence with the same length and different contents correspond to a cycle of a read result. For example, in FIG. 7, the three sequences Sa provided by the streams S1 and S2 of the write-in data 92 correspond to three low-frequency cycles of the read result 86A from time points t0 to t2, from time points t2 to t4, and from time points t4 to t6, while each short sequence Sb corresponds to a high-frequency cycle of the read result 86A, such as the read result 86A from time points t6 to t7 or from time points t7 to t8. In addition, when the write-in power deviates from the ideal power, the read result 86A deviates from the zero level L0, especially in the short sequences or the high-frequency cycles. After the read result 86A is high-pass filtered with the filter 72, deviation of the read result 86A from the zero level corresponds to the low-frequency portion of the read result 86B, so that durations of the low-frequency portion of the read result 86B greater than the zero level are different from durations of the low-frequency portion of the read result 86B smaller than the zero level.

After the slicer 74 slices the read signal 86B into the slice signal 88, level H portions of the slice signal 88 correspond to portions of the read result 86B greater than the level L0, while level L portions of the slice signal 88 correspond to portions of the read result 86B smaller than the level L0. In other words, the level L portions of the slice signal 88 are the portions of the read result 86B smaller than the zero level L0, while the level H portions of the slice signal 88 are the portions of the read result 86B greater than the zero level L0. Therefore, the charger 76A can charge the storage unit 84 during the level H portions of the slice signal 88, while the discharger 76B can discharge the storage unit 84 during the level L portions of the slice signal 88.

In addition, according to the slice signal 88, the decision module 78 of the present invention determines which portion of the write-in data 92 corresponds to the slice signal 88 and generates the control signal 90 for controlling the open or closed state of the switch 82. As mentioned above, main difference of duration between portions of the read result 86B (and the slice signal 88) greater than the zero level L0 and portions of the read result 86B (and the slice signal 88) smaller than the zero level L0 appears in the low-frequency portion of the read result 86B. Besides, the difference becomes unapparent after filtering, caused by accumulating of differences of durations of the low-frequency portion and high-frequency portion, so that the filtered read result cannot accurately indicate deviation of the original read result from the zero level. Therefore, the decision module 78 of the present invention determines the low-frequency portion of the read result 86B (and the slice signal 88) corresponding to the long sequence, and makes the switch 82 closed when the slice signal 88 corresponds to the long sequence, but open when the slice signal 88 corresponds to the short sequence. Therefore, the present invention indicates deviation of the read result 86A from the zero level L0 according to the low-frequency portion of the read result 86B, and performs optimal power control with the data amount of the storage unit 84 corresponding to each write-in power under control of the control module 70.

The decision module 78 can be achieved according to whether the signal level of a portion of the slice signal 88 keeps the same level over a default duration, which means that the portion of the slice signal 88 corresponds to the long sequence or equivalently the low-frequency portion of the read result 86B. The default duration can be longer than the duration of the short stream, but shorter than the duration of the long stream. For example, if a long stream and a short stream have 14 and three bits (14T and 3T), the default duration can be 5T or 6T. Therefore, if the signal level of a portion of the slice signal 88 keeps at the same level over the duration of which a short stream should be, the slice signal 88 corresponds to a long stream.

In FIG. 7, the long sequence Sa of the block SL corresponds to the "1" stream S1 with the level H, and the decision module 78 determines whether the long sequence Sa starts according to whether a portion of the slice signal 88 keeps at the level H over a default duration Te. For example, after the slice signal 88 jumps from the level L to the level H at time point t0, the decision module 78 calculates the level H duration of the slice signal 88. At time point te (also the time point from time point t0 plus the default duration Te), a portion of the slice signal 88 still keeps in the level H, so that the decision module 78 determines that the portion of the slice signal 88 corresponds to a long stream at time point te. Additionally, the write-in data arrangement module 71 arranges a default number of the sequences Sa of the write-in data 92 in the block SL, and the decision module 78 determines that the slice signal 88 has a specific length corresponding to the long sequence from time point te. As a result, after the slice signal 88 falls from the level H to the level L at time point t1, the decision module 78 determines that the slice signal 88 is corresponding to the "0" long stream, so that the decision module 78 changes the signal level of the control signal 90 from the level L to the level H for closing the switch 82, so as to charge or discharge the storage unit 84. As a discharge sequence 91 in FIG. 7 illustrates, while the control signal 90 changes from the level L to the level H at time point t1, the discharger 76B discharges the capacitor C between time points t0 and t2, where the slice signal 88 is corresponding to a long stream S2. Then, the charger 76A charges the capacitor C between time points t2 and t3, where the slice signal 88 is corresponding to a long stream S1. Therefore, from time point t1 to t3, increased charge of the capacitor C is directly proportional to different duration between the streams S1 and S2 (or Td−Tc). Similarly, from time point t3 to t5, increased charge of the capacitor C is directly proportioned to Tg−Tf.

In addition, after the switch 82 is closed at time point t1, the decision module 78 continues the recording level difference of the slice signal 88 between the level H and the level L. Owing to the fixed default number of the long sequences of the write-in data provided by the write-in data arrangement module 71, the decision module 78 can determine how many long streams have passed by way of calculating alternation times between the level H and the level L of the slice signal 88, so as to control the switch 82 with the control signal 90. Moreover, because the short sequences Sb of the block SS continue with the last long sequence Sa of the block SL in the write-in data 92, the decision module 78 makes the switch 82 open at the end of the long "1" stream S1 of the last long sequence Sa, so as to stop increasing the data amount of the storage unit 84 while the slice signal 88 corresponds to the short streams. Therefore, the present invention determines whether the write-in power for the write-in data 92 is a preferred power according to the low-frequency portion of the filtered read result 86B.

In FIG. 7, because the block SL of the write-in data 92 has three long sequences Sa, or six long streams, the decision module 78 determines a duration corresponding to the b 6 long streams by means of detecting five level alternations (or time points t1, t2, t3, t4, and t5) of the slice signal 88 after time point te. Additionally, the level alternation of the slice signal 88 at time point t5 indicates that the last long stream of the block SL is starting, so that the decision module 78 makes the switch 82 open with the changing of the control signal 90 from high to low at time point t5. The present invention does not increase the data amount of the storage unit 84 during the duration corresponding to the last long stream of the block SL, which can prevent negative effects on the data amount when the signal level is alternating from low to high. The block SL includes six long streams with alternative "1"s and "0"s. Deducting the first and the last long streams, the charger 76A and the discharger 76B calculate two zero-crossing differences between two cycles during time points t1 to t5.

The present invention can arrange the write-in data 92 into a plurality of blocks SL, SS, SL, SS, etc. The decision module 78 makes the switch 82 closed during durations of the blocks SL. In this case, the decision module 78 continues detecting durations of the slice signal 88 staying at the same level after making the switch 82 open, so as to determine a start of a first long stream of the next block SL. For example, in FIG. 7, the decision module 78 determines whether the duration of the slice signal 88 staying at the level H is greater than the default duration Te after time point t5, so as to determine the start of the next block SL. Certainly, the duration of the slice signal 88 maintaining the level H is very short during a duration of the block SS, so that the decision module 78 does not make the switch 82 closed until a block SS ends and the next block SL starts.

Figure 8:
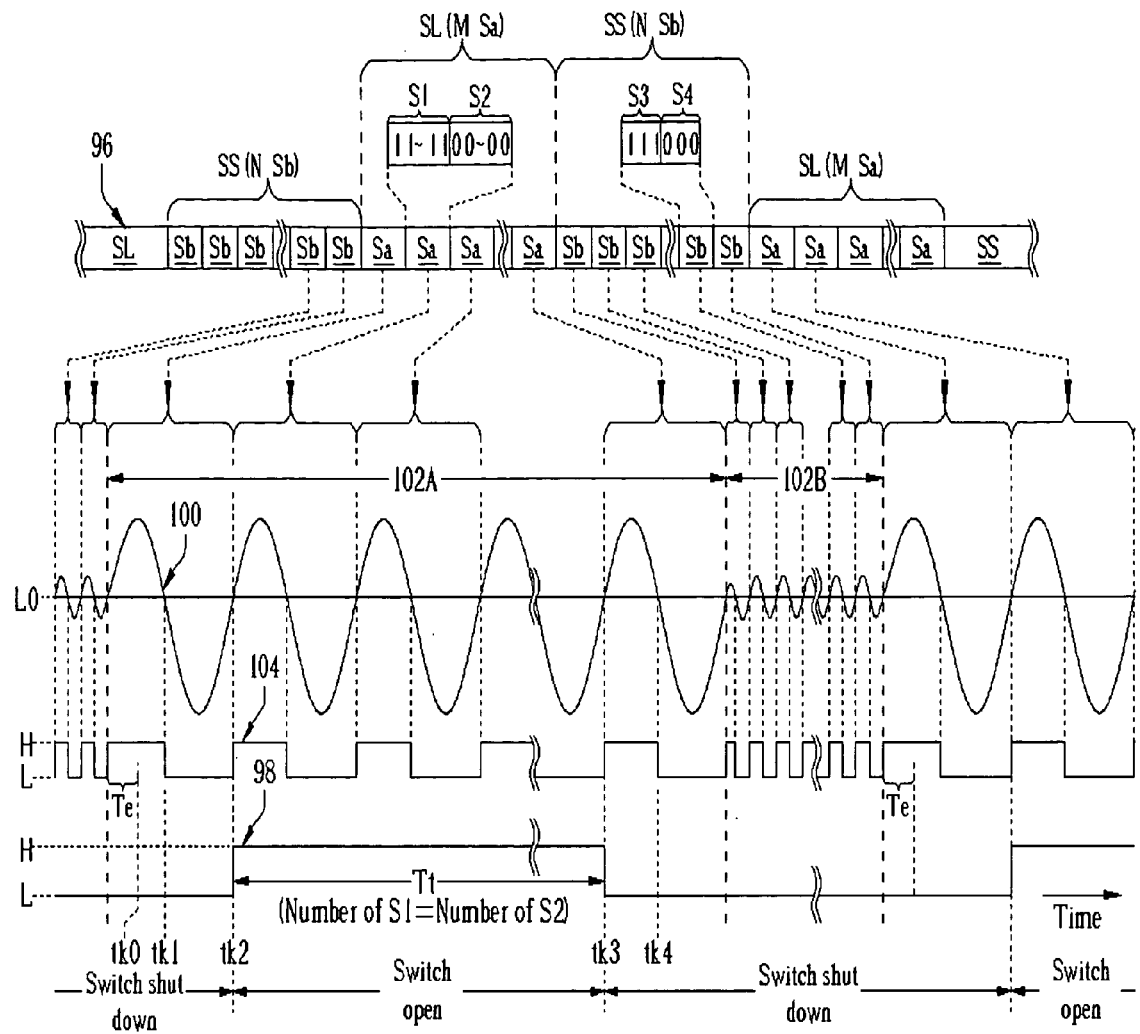
FIG. 8 illustrates an implementation of a write-in data and related signals.

Please refer to FIG. 8 (also FIG. 6 and FIG. 7), which illustrates a data format of a write-in data 96 of the present invention with a waveform-time diagram of a filtered read result 100, a slice signal 104, and a control signal 98, where the X-axis is time scale. The write-in data 96 includes a plurality of blocks SL and SS; each block SL includes M long sequences Sa, while each block SS includes N short the sequences Sb; each long sequence Sa includes "1" and "0" long streams S1 and S2 with the same length (such as a 14-bit long stream), while each short sequence Sb includes "1" and "0" short streams S3 and S4 with the same length (such as a 3-bit short stream). Portions of the read result corresponding to the long sequences have greater amplitude and cycle than the short sequences, so that the block SL corresponds to a low-frequency portion of the read result 100, or a read signal 102A, while the block SS corresponds to a read signal 102B.

In the present invention, a proportion of M to N is for adjusting effect of the high-pass filter when high-pass filtering an original read signal. For example, if the proportion of M to N is an inverse proportion of number of bits of the long stream to number of bits of the short stream (that is, M:N=3:14), the duration of the block SL is equal to the duration of the block SS. After high-pass filtering, deviation of zero level in high-frequency portions of the original read result corresponding to the block SS causes the same deviation of zero level in low-frequency portions of the filtered read result. If the proportion of M to N is decreased (such as to 3:17), the duration of the block SL is greater than the duration of the block SS while the deviation of zero level in low-frequency portions of the filtered read result becomes more serious.

Furthermore, unlike the embodiment in FIG. 7, after detecting a first long stream of the block SL, the decision module 78 can still make the switch 82 open while the next long stream starts. For example, in FIG. 8, the decision module 78 detects a start of a long stream corresponding to a read result at time point tk0, and changes the control signal 98 from the level L to the level H at time point tk2 (where the signal level of the slice signal 104 changes again), instead of at time point tk1. Similarly, time points for the decision module 78 to change the control signal 98 to low can be chosen at any point corresponding to the long stream. For example, in FIG. 8, the decision module 78 makes the switch 82 on at time point tk3, instead of at time point tk4. Nevertheless, a duration Tt (from time point tk2 to time point tk3) for the decision module 78 keeping the switch 82 closed should correspond to an even number of the "1" and "0" long streams S1 and S2 in that combination of a "0" and a "1" long streams S1 and S2 can form a cycle corresponding to the read result, so as to generate a zero-crossing difference. That is, the decision module 78 determines that the evaluation module 80 has evaluated zero-crossing differences of the read signal 102A during the duration Tt by means of detecting an odd number of level alternation of the slice signal 104 during the duration Tt.

The decision module 78 of the present invention can be a state machine or a firmware with program codes. The evaluation module 80, the filter 72, the slicer 74, and the control module 70 can be included into a circuit or a chip. In addition, the decision module 78 can determine whether durations of the slice signal staying at a level are greater than the default duration Te with a high-frequency timer. For example, if the default duration Te is set to 5T and a timer with a cycle 0.01T is set for calculating durations of the slice signal 88 staying at the level H, the decision module 78 calculates a cycle number of the cycle 0.01T after the signal level of the slice signal 88 changes from the level L to the level H. If the cycle number of the cycle 0.01T is 500 (or 5/0.01), the decision module 78 determines that the slice signal has corresponded to a long stream. Additionally, the charger and the discharger of the present invention can be digital counters with summing and subtracting functions in place of power supplies and capacitors C, and the storage unit can be a register. In this case, the digital counters can function based on the high-frequency timer, wherein only the digital counter in place of the charger sums data stored in the register, while the digital counter in place of the discharger subtracts the data. Therefore, data stored in the register can be a basis for calculating the beta-parameter.

In all, the decision module 78 of the present invention is set for the specific format of the write-in data. The decision module 78 can determine the zero-crossing difference of the high-pass filtered read result only corresponding to the long stream of the write-in data. Therefore, the data amount of the storage unit 84 is prevented from being affected by high-frequency portions of the read result, so as to increase sensitivity of the beta-parameter corresponding to the write-in power. In comparison with the prior art, the present invention can determine a portion of the high-pass filtered read result corresponding to the long stream, and calculate a beta-parameter based on such portion, so that the beta-parameter can correspond to the write-in power provided by the optical disk drive more precisely. Finally, the optical disk drive can write onto a optical disk with a preferred power to perform optimal power control.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for performing optimal power control of an optical disk drive based on a beta-parameter for determining whether a default power is equal to an optimal write-in power for writing data onto an optical disk; the method comprising:
    setting a write-in data, the write-in data comprising a plurality of first sequences and second sequences;
    reading the write-in data from the optical disk and generating a corresponding read result after writing the write-in data onto the optical disk with the default power; wherein the read result comprises a first read signal and a second read signal each corresponding to the first sequence and the second sequence; and
    processing an evaluation step according to a portion of the first read signal, instead of the second read signal, with signal level greater or smaller than a default level for summing the beta-parameter.

2. The method of claim 1 wherein the beta-parameter does not change as the second read signal changes in the evaluation step.

3. The method of claim 1 wherein the first sequence comprises a plurality of first data streams each comprising a default number of bits with the same contents, while the second sequence comprises a plurality of second data streams each comprising a default number of bits with the same contents; wherein a bit number of the first data stream is greater than a bit number of the second data stream.

4. The method of claim 1 further comprising:
    generating a slice signal according to the read result before processing the evaluation step, wherein a portion of the slice signal with signal level equal to a first level corresponds to a portion of the read result with signal level greater than the default level, while a portion of the slice signal with signal level equal to a second level corresponds to a portion of the read result with signal level smaller than the default level.

5. The method of claim 4 further comprising:
    after generating the slice signal, determining starts and ends of the first read signal and the second read signal in the read result according to durations of the first level and the second level of the slice signal.

6. The method of claim 5 further comprising:
    when determining starts and ends of the first read signal and the second read signal, if a duration of the slice signal of the first level or the second level is greater than a default time, the read result corresponds to the first sequence during the default time.

7. The method of claim 5 wherein the evaluation step determines starts and ends of the first read signal and the second read signal according to the slice signal for summing the beta-parameter during a duration of the first read signal and not summing the beta-parameter during a duration of the second read signal.

8. The method of claim 4 further comprising: before generating the slice signal, high-pass filtering the read result for corresponding a portion of the slice signal with signal level equal to a first level to a portion of the filtered read result with signal level greater than the default level, and corresponding a portion of the slice signal with signal level equal to a second level to a portion of the filtered read result with signal level smaller than the default level.

9. The method of claim 1 wherein when processing the evaluation step during a duration of the first read signal, a capacitor is charged if the signal level of the first read signal is greater than the default level, while the capacitor is discharged if the signal level of the first read signal is smaller than the default level.

10. The method of claim 9 wherein when processing the evaluation step, the capacitor is prevented from being charged and discharged during the duration of the second read signal.

11. The method of claim 10 further comprising: evaluating the beta-parameter according to the capacitor charge.

12. An optical disk drive comprising:
    an access circuit for writing a write-in data onto an optical disk with a default power, the access circuit capable of reading the written write-in data in the optical disk and generating a corresponding read result; wherein the write-in data comprises a plurality of first sequences and second sequences, the read result comprising a first read signal and a second read signal each corresponding to the first sequence and the second sequence; and
    an evaluation module for summing a beta-parameter in a storage unit according to a portion of the first read signal, instead of the second read result, with signal level greater or smaller than a default level.

13. The optical disk drive of claim 12 wherein the first sequence comprises a plurality of first data streams each comprising a default number of bits with the same contents, while the second sequence comprises a plurality of second data streams each comprising a default number of bits with the same contents; wherein a bit number of the first data stream is greater than a bit number of the second data stream.

14. The optical disk drive of claim 12 further comprising:
a slicer between the access circuit and the evaluation module for generating a slice signal according to the read result, wherein a portion of the slice signal with signal level equal to a first level corresponds to a portion of the read result with signal level greater than the default level, while a portion of the slice signal with signal level equal to a second level corresponds to a portion of the read result with signal level smaller than the default level.

15. The optical disk drive of claim 14 wherein the evaluation module comprises a decision module for determining starts and ends of the first read signal and the second read signal in the read result according to durations of the first level and the second level of the slice signal.

16. The optical disk drive of claim 15 wherein when the decision module is determining starts and ends of the first read signal and the second read signal, if a duration of the slice signal of the first level or the second level is greater than a default time, the decision module determines the read result corresponding to the first sequence during the default time.

17. The optical disk drive of claim 15 wherein the evaluation module further comprises:
a charger for providing electricity for charging/discharging the storage unit for summing beta-parameter stored in storage unit; and
a switch between the charger and the storage unit for controlling connection between the charger and the storage unit; the switch capable of transmitting electricity provided by the charger to the storage unit during the duration of the first read signal for summing the beta-parameter based on the first read signal according to starts and ends of the first read signal and the second read signal provided by the decision module; the switch stopping transmitting electricity provided by the charger to the storage unit during the duration of the second read signal for stopping summing of the beta-parameter based on the second read signal.

18. The optical disk drive of claim 14 further comprising:
a high-pass filter between the access circuit and the slicer for high-pass filtering the read result and transmitting the filtered read result to the slicer.

19. The optical disk drive of claim 12 wherein the storage unit comprises a capacitor for storing charge corresponding to the beta-parameter.

20. The optical disk drive of claim 19 further comprising:
a control module for controlling operations of the optical disk drive, the control module capable of evaluating the beta-parameter according to charge stored in the capacitor.

* * * * *